United States Patent
Uematsu et al.

(10) Patent No.: US 12,080,933 B2
(45) Date of Patent: Sep. 3, 2024

(54) SIGNAL TRANSMISSION DEVICE

(71) Applicant: Hitachi Astemo, Ltd., Hitachinaka (JP)

(72) Inventors: Yutaka Uematsu, Tokyo (JP);
Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 545 days.

(21) Appl. No.: 17/421,796

(22) PCT Filed: Dec. 20, 2019

(86) PCT No.: PCT/JP2019/050024
§ 371 (c)(1),
(2) Date: Jul. 9, 2021

(87) PCT Pub. No.: WO2020/149101
PCT Pub. Date: Jul. 23, 2020

(65) Prior Publication Data
US 2022/0094028 A1 Mar. 24, 2022

(30) Foreign Application Priority Data

Jan. 16, 2019 (JP) .................................. 2019-005207

(51) Int. Cl.
*H03H 7/38* (2006.01)
*H01P 1/20* (2006.01)
(Continued)

(52) U.S. Cl.
CPC ............ *H01P 1/203* (2013.01); *H01P 1/2007* (2013.01); *H01P 1/213* (2013.01); *H04N 21/61* (2013.01);
(Continued)

(58) Field of Classification Search
CPC ......... H01P 5/02; H01P 1/2007; H03H 7/383; H03H 7/38; H03H 1/0007; H05K 3/46; H05K 3/429; H05K 1/025
(Continued)

(56) References Cited

U.S. PATENT DOCUMENTS 4,327,342 A 4/1982 De Ronde
2003/0122637 A1 7/2003 Chiu
(Continued)

FOREIGN PATENT DOCUMENTS

JP S59-125102 A 7/1984
JP S61-083320 U 6/1986
(Continued)

OTHER PUBLICATIONS

International Search Report with English translation and Written Opinion issued in corresponding application No. PCT/JP2019/050024 dated Mar. 10, 2020.

*Primary Examiner* — Stephen E. Jones
(74) *Attorney, Agent, or Firm* — Foley & Lardner LLP

(57) ABSTRACT

A signal transmission device including a signal wiring, a wide wiring that is formed continuously with one and the other of the signal wirings and has a wiring width larger than a wiring width of at least the one or the other of the signal wirings, a power wiring to which a signal/power separation filter is connected via a branch wiring branching from the wide wiring, and an open stub wiring that is connected to the branch wiring and has an open tip.

15 Claims, 14 Drawing Sheets

(51) Int. Cl.
  *H01P 1/203* (2006.01)
  *H01P 1/213* (2006.01)
  *H04N 21/61* (2011.01)
  *H05K 1/02* (2006.01)
  *H05K 3/42* (2006.01)
  *H05K 3/46* (2006.01)

(52) U.S. Cl.
  CPC .............. *H05K 1/025* (2013.01); *H05K 3/429* (2013.01); *H05K 3/46* (2013.01)

(58) Field of Classification Search
  USPC ......... 333/246; 330/267, 296, 261, 273, 285
  See application file for complete search history.

(56) References Cited

U.S. PATENT DOCUMENTS

| | | |
|---|---|---|
| 2010/0200287 A1 | 8/2010 | Tsubamoto |
| 2011/0032052 A1 | 2/2011 | Chen et al. |
| 2013/0187445 A1 | 7/2013 | Mutzabaugh |
| 2014/0002213 A1* | 1/2014 | Clark, Jr. .................. H01P 5/20 |
| | | 333/246 |
| 2014/0253262 A1* | 9/2014 | Hsieh ................. H01L 23/5223 |
| | | 333/246 |

FOREIGN PATENT DOCUMENTS

| | | |
|---|---|---|
| JP | H11-330808 A | 11/1999 |
| JP | 2010-182982 A | 8/2010 |

\* cited by examiner (A)             (B)

SIGNAL TRANSMISSION DEVICE

TECHNICAL FIELD

The present invention relates to a signal transmission device.

BACKGROUND ART

According to PTL 1, a monitor circuit and a camera circuit are connected by a coaxial cable, and a signal and power are superimposed on the coaxial cable and transmitted. On a path of a signal line, a DC cutoff capacitor is arranged in the immediate vicinity of a transmitting/receiving IC, and an active filter is inserted into a power line at a connection point with the signal line, so that the signal and the power are separated according to a range of a filter frequency.

CITATION LIST

Patent Literature

PTL 1: US 2013/0187445 A

SUMMARY OF INVENTION

Technical Problem

It has been difficult to widen a filter frequency range to a radio frequency side.

Solution to Problem

According to a first aspect of the present invention, a signal transmission device preferably includes a signal wiring, a wide wiring that is formed continuously with one and the other of the signal wirings and has a wiring width larger than a wiring width of at least the one or the other of the signal wirings, a power wiring to which a signal/power separation filter is connected via a branch wiring branching from the wide wiring, and an open stub wiring that is connected to the branch wiring and has an open tip.

According to a second aspect of the present invention, a signal transmission device preferably includes a signal wiring, a wide wiring that is formed continuously with the signal wiring and has a wiring width larger than a wiring width of the signal wiring, a power wiring to which a signal/power separation filter is connected via a branch wiring branching from the wide wiring, and an open stub wiring that is connected to the branch wiring and has an open tip.

Advantageous Effects of Invention

According to the present invention, a range of a filter frequency can be widened to the radio frequency side.

A problem, configuration, and effect other than those described above will be clarified by description of embodiments below.

DESCRIPTION OF EMBODIMENTS

Figure 1:
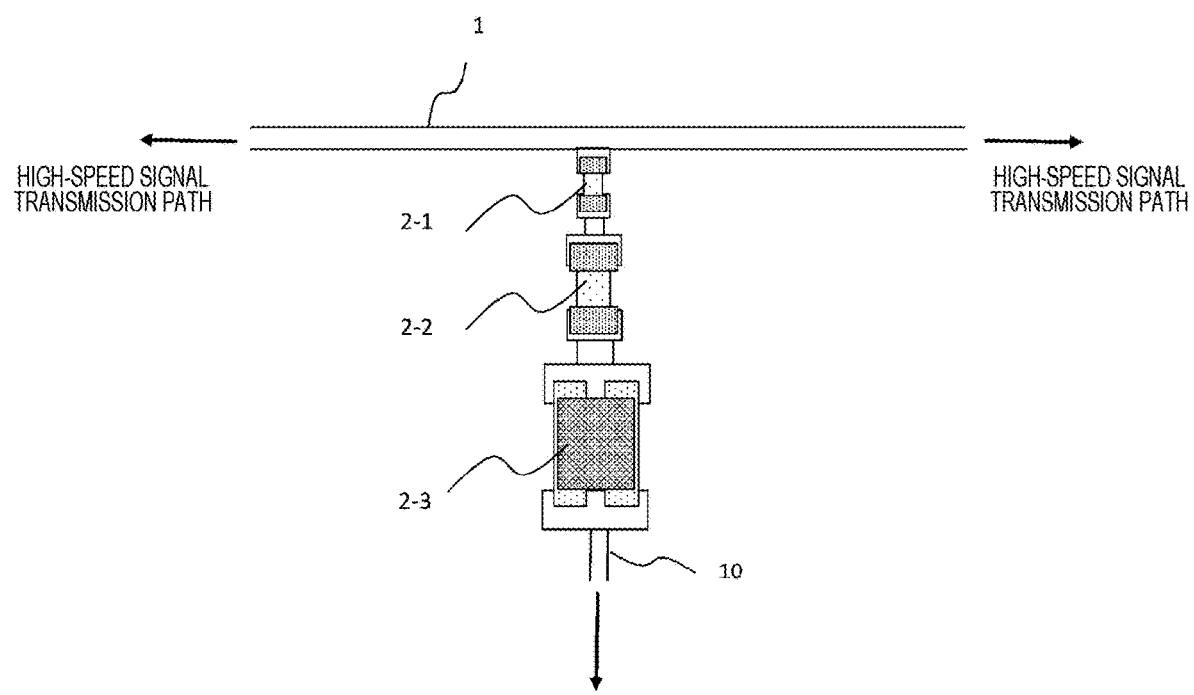
FIG. 1 is a configuration diagram of a signal transmission device in a comparative example.

Hereinafter, an embodiment of the present invention will be described with reference to the drawings. Description and drawings below are examples for describing the present invention, and omission and simplification are made as appropriate for the sake of clarity of description. The present invention can be carried out in other various forms. Unless otherwise specified, each constituent may be singular or plural.

There is a case where a position, size, shape, range, and the like of each constituent shown in the drawings do not represent an actual position, size, shape, range, and the like, in order to facilitate understanding of the invention. For this reason, the present invention is not necessarily limited to a position, size, shape, range, and the like disclosed in the drawings.

In a case where there are a plurality of constituents having the same or similar functions, description may be made by attaching different subscripts to the same reference numerals. However, in a case where a plurality of such constituents do not need to be distinguished from each other, the description may be made by omitting a subscript.

COMPARATIVE EXAMPLE

Before the present embodiment is described, a comparative example to be compared with the present embodiment will be described.

FIG. 1 is a configuration diagram of a signal transmission device in the comparative example. The signal transmission device branches at the center of a signal wiring 1 and is connected to a power wiring 10 via a signal/power separation filter including inductor components 2-1 to 2-3. As illustrated in FIG. 1, the inductor components 2-1 to 2-3 often have a configuration using a plurality of components having different sizes and characteristics.

Figure 2:
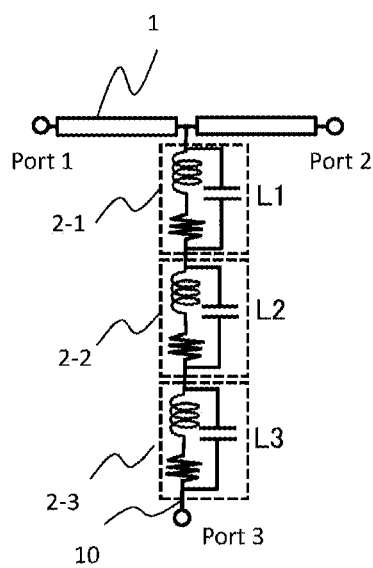
FIGS. 2(A) and 2(B) are diagrams illustrating an equivalent circuit and an impedance profile of the signal transmission device.
Figure 2:
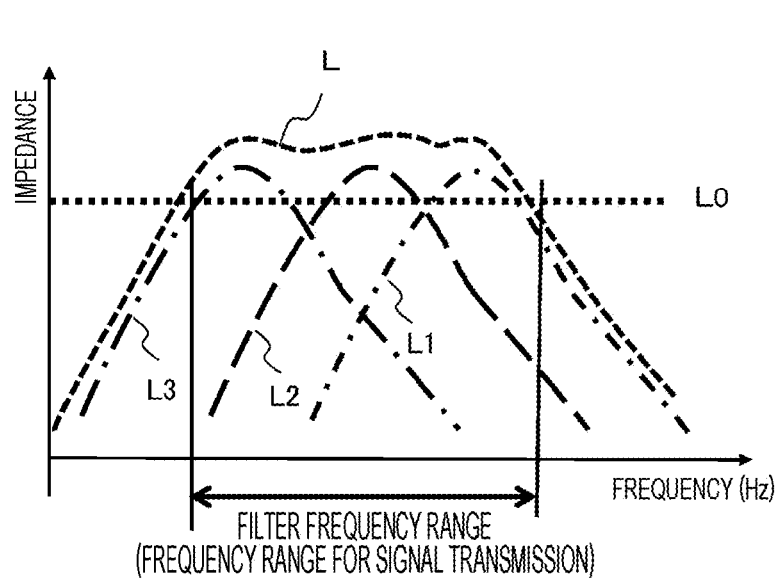

FIG. 2(A) illustrates an equivalent circuit of the signal transmission device. FIG. 2(B) illustrates an impedance profile of the signal transmission device. In FIG. 2(B), the horizontal axis represents frequency, and the vertical axis represents impedance.

As illustrated in FIG. 2(A), the inductor component is not of a simple inductance, and is expressed by a circuit in which a resistance component is in series with the inductance and, further, a parasitic capacitance component is in parallel with the inductance. That is, the inductor components 2-1 to 2-3 are a parallel LC circuit. As illustrated in FIG. 2(B), the inductor components have an impedance profile of a mountain type that takes a maximum value of impedance at an antiresonance frequency determined by inductance L and capacitance C. The impedance profiles of the inductor components 2-1 to 2-3 are L1 to L3, respectively, and a combined impedance profile of the signal/power separation filter is L.

The role of the signal/power separation filter is to prevent energy from being transmitted to the power wiring 10 side by insertion of a component having a sufficiently high impedance with respect to the signal wiring 1 into a connection point with the power wiring 10. As a function of the signal/power separation filter, it is necessary to set a filter frequency range (signal transmission frequency range) in which energy of a signal exists to impedance of reference impedance L0 or more. In contrast, since impedance of a single inductor component cannot cover a wide frequency range, a filter frequency range is expanded by using a plurality of components having different antiresonance frequencies. FIG. 2(B) shows an example in which the filter frequency range is expanded by using three of the inductor components 2-1 to 2-3. By providing the inductor component 2-1 having the highest antiresonance frequency at the connection point with a signal line, a role of preventing radio-frequency energy leakage is achieved.

However, in this comparative example, in order to widen the filter frequency range to the radio frequency side, it is necessary to utilize a component having a high antiresonance frequency. However, due to the structure of the inductor component, there is a limit to increasing an antiresonance frequency, and it has been difficult to configure a filter up to a filter frequency range of 10-GHz level, for example.

According to the embodiment described below, in such a signal transmission device, it is possible to provide a structure in which a signal/power separation filter corresponding to a high-speed signal exceeding 5 Gbps is formed on a printed circuit board at low cost.

First Embodiment

A signal transmission device 20 in a first embodiment will be described with reference to the drawings. The signal transmission device 20 can be applied to various product fields in which a power is superimposed on a signal line and transmitted, such as communication between a camera of an in-vehicle device and an electronic control unit (ECU) as a representative, and other information devices and infrastructure control devices.

Figure 3:
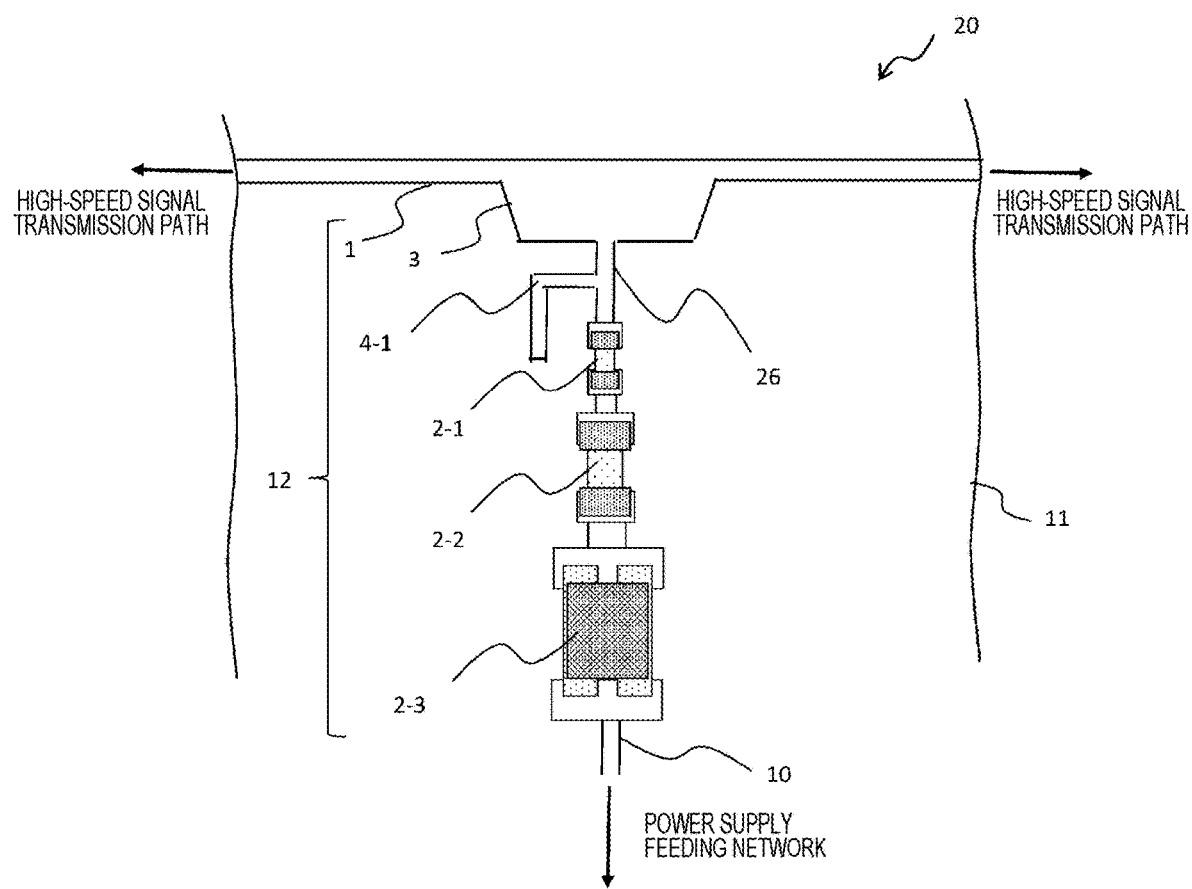
FIG. 3 is a diagram illustrating a configuration of the signal transmission device according to a first embodiment.

FIG. 3 is a diagram illustrating a configuration of the signal transmission device 20 in the first embodiment. As illustrated in FIG. 3, the signal wiring 1 is formed on a substrate 11 by printed wiring. The signal wiring 1 is a wiring connected to a device such as a communication LSI.

A central portion of the signal wiring 1 forms a wide wiring 3. Then, the wide wiring 3 branches to a branch wiring 26, and is connected to the power wiring 10 via the inductor components 2-1 to 2-3 constituting the signal/power separation filter. Furthermore, what is called an open stub wiring 4-1 in which a wiring branches from the branch wiring 26 connecting the inductor component 2-1 and the wide wiring 3 and a tip of the wiring is in an open state is formed by printed wiring. As described above, a signal transmission circuit 12 including the signal wiring 1, the wide wiring 3, the branch wiring 26, the open stub wiring 4-1, the signal/power separation filter, and the power wiring 10 is disposed on the substrate 11 to constitute the signal transmission device 20.

By forming the wide wiring 3 on the substrate 11, a ratio of the impedance in the propagation direction of the signal wiring 1 to the impedance of the branch wiring 26 becomes relatively large, and the branch wiring 26 becomes to have high impedance, so that a high-speed signal of the signal wiring 1 hardly flows to the power wiring 10 side. Note that the width of the wide wiring 3 is desirably at least twice or more the width of the signal wiring 1. Further, the wide wiring 3 is formed continuously with one and the other of the signal wirings 1, and has a wiring width wider than a wiring width of at least one or the other of the signal wirings 1. In other words, one or the other of the signal wirings 1 connected to the wide wiring 3 may have the same width as the wide wiring 3. This is to reduce the reflection coefficient at the connection point by making an impedance difference between the signal/power separation filter and the branch wiring 26 connecting the signal wiring 1 twice or more.

Furthermore, by inserting the open stub wiring 4-1, a characteristic of a filter of the signal transmission circuit 12 can be obtained at a frequency corresponding to a stub length. The shorter the stub length, the more a center frequency of the filter can be shifted to the radio frequency side. Note that, although the example in which the open stub wiring 4-1 has an L shape is shown, the open stub wiring 4-1 may have an I shape or other shapes.

Figure 4:
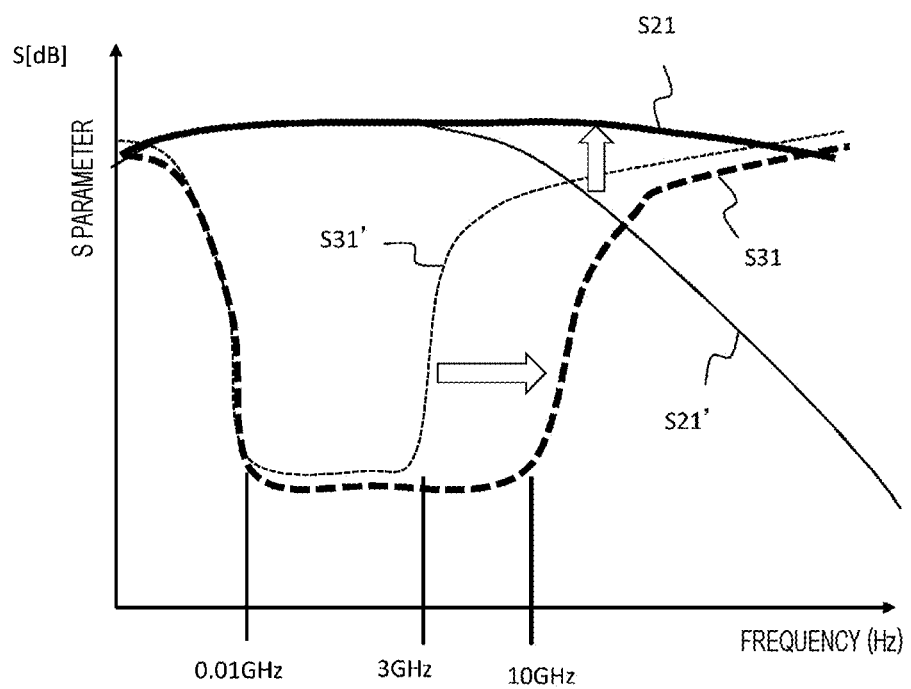
FIG. 4 is a diagram illustrating a transmission characteristic of the first embodiment and the comparative example.

FIG. 4 is a diagram illustrating a transmission characteristic of the present embodiment and the comparative example. The horizontal axis represents frequency, and the vertical axis represents S parameter. As illustrated in FIG. 4, a frequency range S31 covered by the filter according to the present embodiment can be expanded further to the radio frequency side than a frequency range S31' in the comparative example. The frequency range S31' in the comparative example is 0.01 GHz to 3 GHz, whereas the frequency range S31 according to the present embodiment is 0.01 GHz to 10 GHz. Further, a transmission characteristic S21 of a signal according to the present embodiment can be expanded to a frequency range higher than a transmission characteristic S21' in the comparative example.

As described above, in the present embodiment, the frequency range covered by the filter can be expanded to the radio frequency side, and the transmission characteristic of a signal can be expanded to a higher frequency range.

Furthermore, in the present embodiment, since the filter can be configured by applying pattern wiring to a substrate, additional cost can be suppressed.

Second Embodiment

Next, the signal transmission device according to a second embodiment will be described. Note that the same portions as those of the first embodiment are denoted by the same reference numerals, and omitted from the description.

In order to maintain excellent signal quality, flatness of characteristic impedance of a signal wiring is important. When the wide wiring 3 described in the first embodiment is provided, there is a possibility that characteristic impedance of the portion decreases, which causes electrical reflection. In view of the above, in the present embodiment, flattening of impedance is achieved by separating a ground wiring serving as a signal return path from the wide wiring 3.

Figure 5:
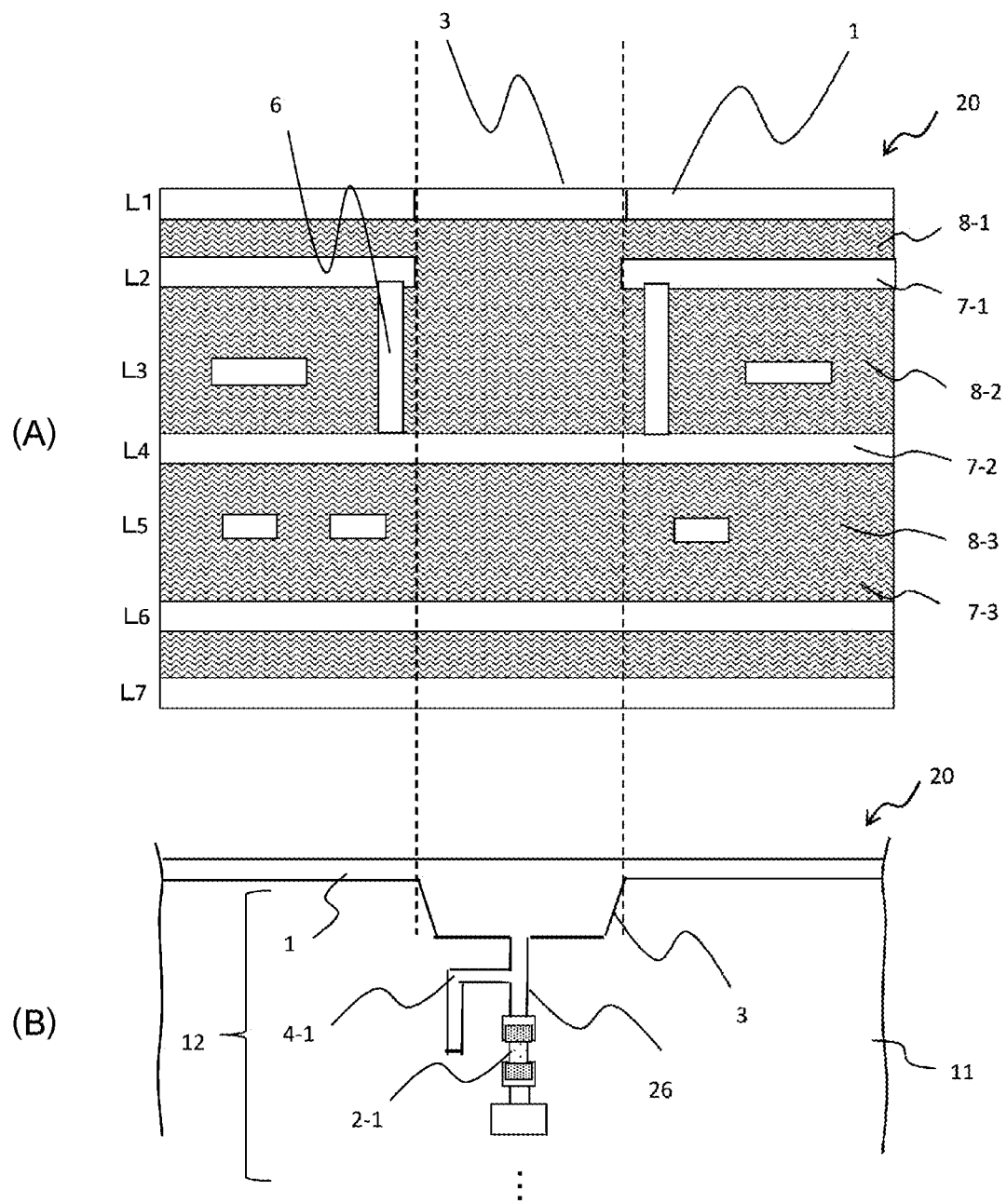
FIGS. 5(A) and 5(B) are a cross-sectional view and a top view of a substrate of the signal transmission device according to a second embodiment.

FIG. 5(A) is a cross-sectional view of a substrate of the signal transmission device 20 in the second embodiment, and FIG. 5(B) is a top view of the signal transmission device 20 in the second embodiment.

As illustrated in FIG. 5(A), the substrate 11 is a multilayer wiring substrate, and includes layers L1 to L7. A return path of the signal wiring 1 is a ground wiring 7-1 on the layer L2. In a manner corresponding to the portion of the wide wiring 3 illustrated in FIG. 5(B), as illustrated in FIG. 5(A), the return path is changed from the ground wiring of on the layer L2 to a ground wiring 7-2 on the lower layer L4 via a ground via 6. That is, the distance between the wide wiring 3 and the ground wiring 7-2 on the lower layer of the substrate 11 is longer than the distance between the signal wiring 1 and the around wiring 7-1 on a lower layer of the substrate 11. As described above, the characteristic impedance is adjusted by separating the ground wiring 7-2 from the wide wiring 3.

Note that the width of the wide wiring 3 is desirably at least twice or more the width of the signal wiring 1. Further, one of the signal wirings 1 connected to the wide wiring 3 may have the same width as the wide wiring 3. This is to reduce the reflection coefficient at the connection point by making an impedance difference between the signal/power separation filter and the branch wiring 26 connecting the signal wiring 1 twice or more.

Further, the length of the wide wiring 3 is shorter than a wavelength corresponding to time that is 1/10 of the period of a signal transmitted through the signal wiring 1. For example, in a case where a signal of 10 Gbps is allowed to pass through a microstrip line having an effective relative permittivity of 3, the period of the signal is 100 ps, and therefore a wavelength A that is 1/10 of the period of the signal can be calculated by Equation (1) below.

$$\lambda = v/f = Tv = 10 \ [\text{ps}] \times 3 \times 10^8 \ [\text{m/s}]/\sqrt{3} = 1.73 \ [\text{mm}] \quad (1)$$

Here, v is a propagation speed of an electromagnetic wave, f is a frequency, and T is a period. If the wide wiring 3 is made longer than the value calculated by Equation (1), the influence of the discontinuity of impedance occurs.

Further, it is preferable that a connection portion between the signal wiring 1 and the wide wiring 3 be formed in a tapered shape by forming an inclination on the wide wiring 3 in order to avoid extreme impedance discontinuity. Ideally, the angle of the inclination is 45 degrees. However, in a case where it is difficult to provide an inclination of 45 degrees due to the restrictions on the width and length of the wide wiring 3, an angle up to 60 degrees is recommended.

Third Embodiment

The signal transmission device 20 in a third embodiment will be described with reference to FIGS. 6 and 7. Note that the same portions as those of the first embodiment are denoted by the same reference numerals, and omitted from the description. In the third embodiment, the frequency range of the filter of the signal transmission device 20 described in the first embodiment is further expanded.

Figure 6:
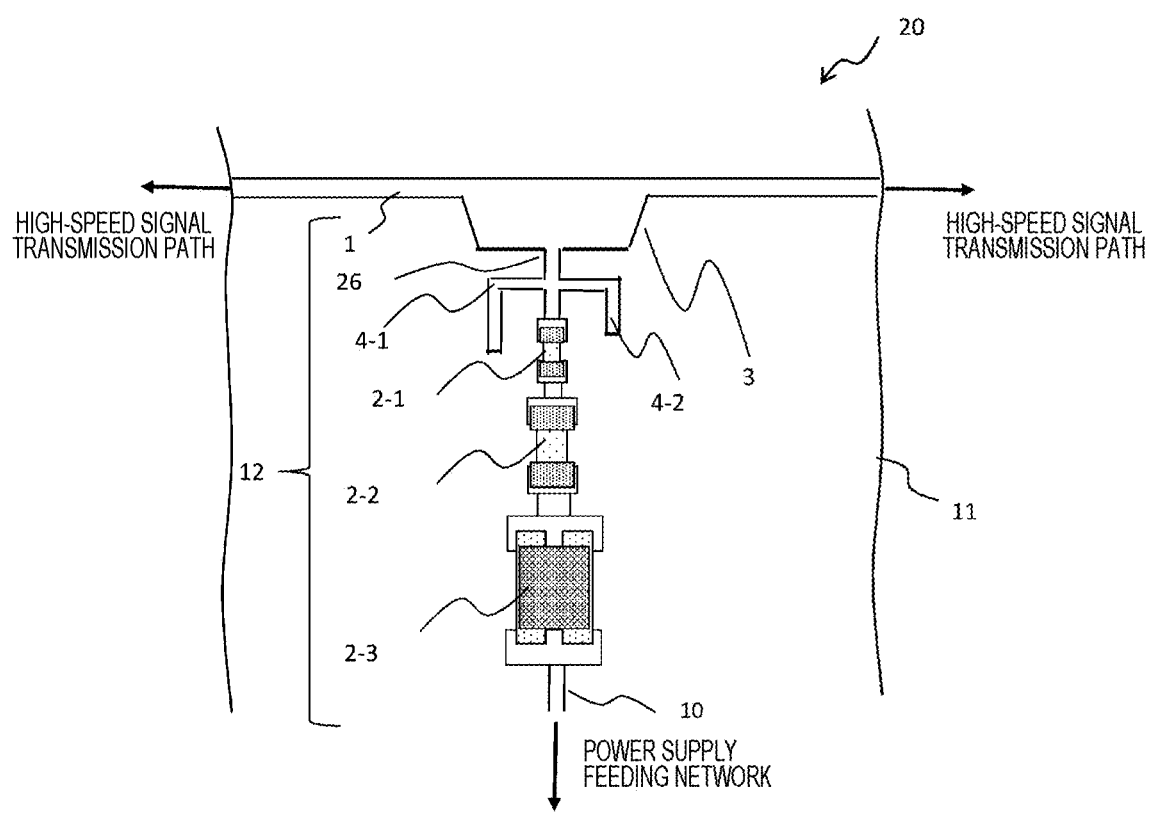
FIG. 6 is a diagram illustrating a configuration of the signal transmission device according to a third embodiment.

FIG. 6 is a diagram illustrating a configuration of the signal transmission device 20 in the present embodiment. As illustrated in FIG. 6, the number of the open stub wirings 4-1 and 4-2 connected to the branch wiring 26 connecting the signal wiring 1 and the inductor component 2-1 is increased to a plurality. In FIG. 6, two of the open stub wirings, the open stub wirings 4-1 having a long stub S1 and the open stub wiring 4-2 having a short stub S2, are connected. A center frequency of a cutoff frequency of the open stub wiring is determined by a wiring length of the open stub wiring. That is, open stub wirings having different wiring lengths have different cutoff frequencies. Therefore, by connecting a plurality of such open stub wirings, the frequency range of the filter in the signal transmission circuit 12 can be expanded.

Figure 7:
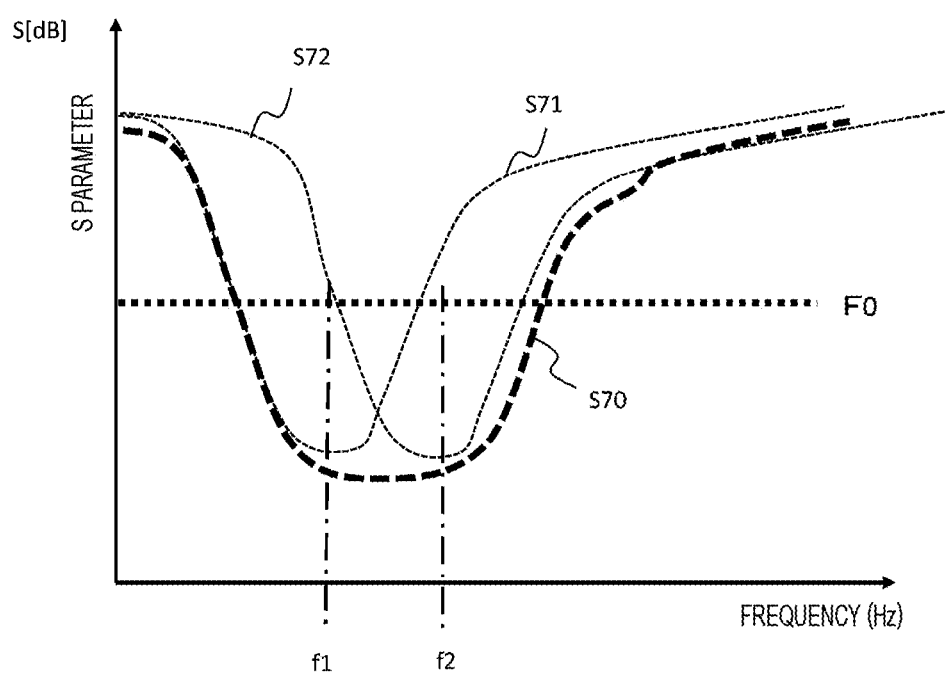
FIG. 7 is a diagram illustrating a transmission characteristic according to the third embodiment.

FIG. 7 is a diagram illustrating a transmission characteristic of the present embodiment. The horizontal axis represents frequency, and the vertical axis represents S parameter. The filter characteristic of the open stub wiring 4-1 having the long stub S1 is denoted by S71, and the filter characteristic of the open stub wiring 4-2 having the short stub S2 is denoted by S72. Furthermore, a combined filter characteristic of the two open stub wirings 4-1 and 4-2 is denoted by S70. The long stub S1 has a relatively low cutoff frequency f1 and the short stub S2 has a relatively high cutoff frequency f2. Due to a difference in the cutoff frequencies, the combined filter characteristic S70 has a wider frequency range in a filter reference F0, and a wide filter can be configured.

Note that, in a case where the open stub wirings having the same length are connected, a loss amount of the filter characteristic can be increased with the cutoff frequency unchanged. In a case where a larger loss is required, a plurality of open stubs having the same length may be provided.

Further, in this example, two types of the open stub wirings are combined. However, the number of combinations may be larger than this. By combining a wider variety of open stub wirings, a wider range of frequencies can be covered.

Fourth Embodiment

The signal transmission device 20 in a fourth embodiment will be described with reference to FIGS. 8, 9(A), and 9(B). Note that the same portions as those of the third embodiment are denoted by the same reference numerals, and omitted from the description. In the third embodiment, since the frequency is determined by the length of the open stub wiring, a large mounting area is required on the substrate 11. In view of the above, the present embodiment provides a high-density open stub structure (hereinafter, referred to as via stub wiring) using a through hole.

Figure 8:
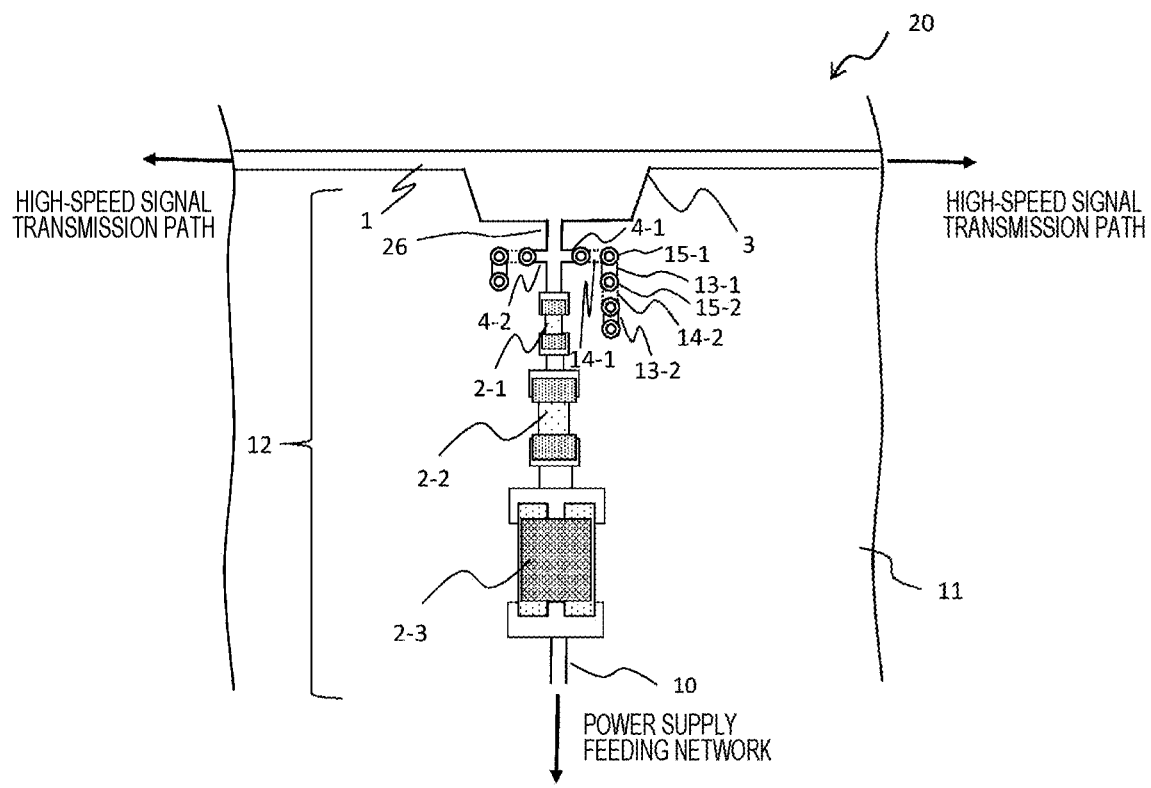
FIG. 8 is a diagram illustrating a configuration of the signal transmission device according to a fourth embodiment.

FIG. 8 is a top view illustrating a configuration of the signal transmission device 20 according to the present embodiment. The open stub wirings 4-1 and 4-2 form a via stub wiring in which wirings on the front surface and the back surface of the substrate 11 are connected by a plurality of through holes 15-1 to 15-4 penetrating the substrate 11.

Figure 9:
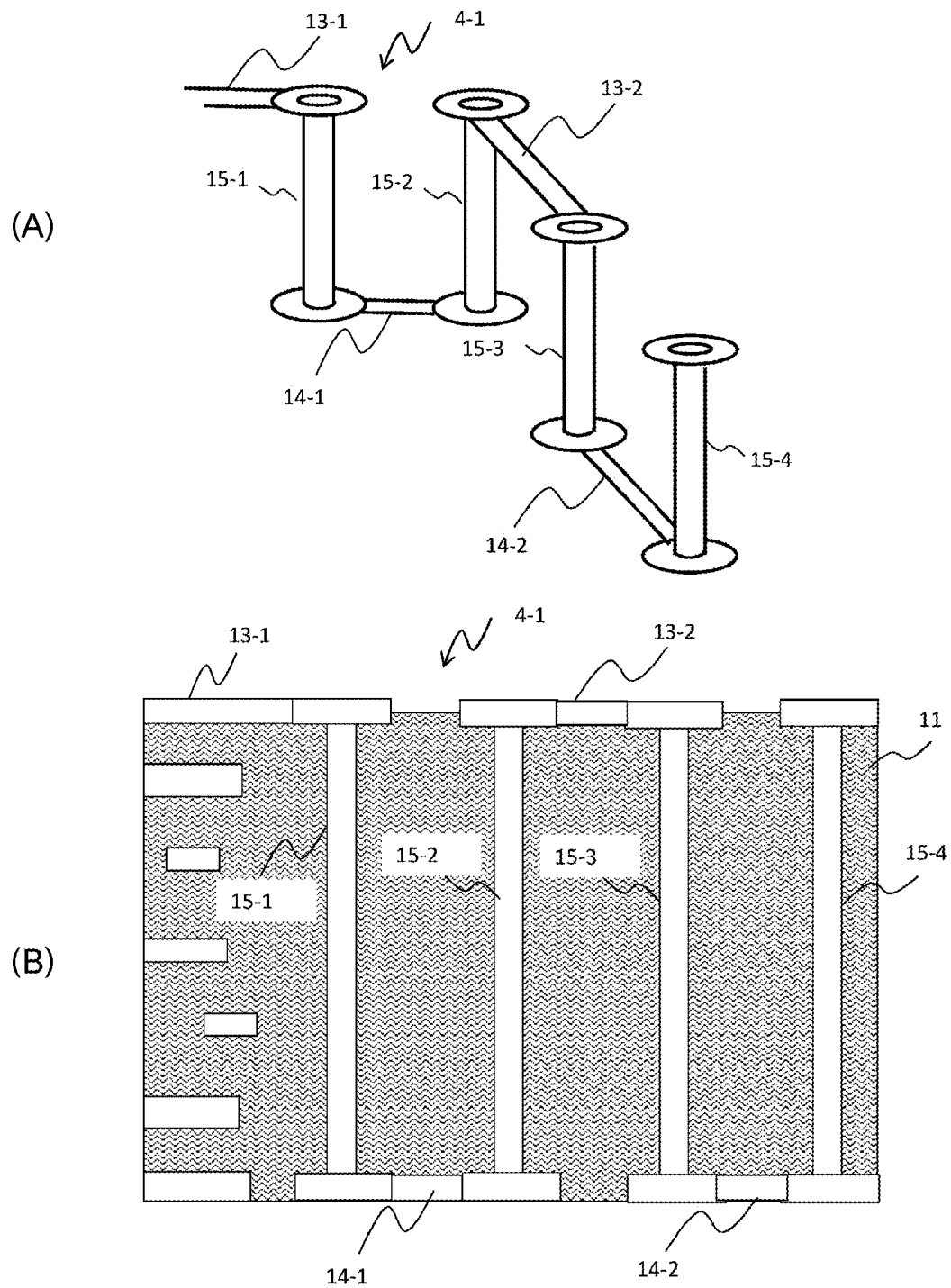
FIGS. 9(A) and 9(B) are a substrate perspective oblique view and a substrate cross-sectional view of a wiring according to a fourth embodiment.

FIG. 9(A) illustrates a substrate perspective oblique view of the wiring in the present embodiment, and FIG. 9(B) illustrates a substrate cross-sectional view. As illustrated in FIG. 9(A), the open stub wiring 4-1 is configured by connecting wirings 13-1 and 13-2 on the upper surface of the substrate 11 and the wirings 14-1 and 14-2 on the back surface of the substrate 11 by a plurality of the through holes 15-1 to 15-4. As illustrated in FIG. 9(B), there is a characteristic that an open stub resonance frequency is lowered by gaining a stub length by allowing reciprocation between the top layer and the bottom layer of the substrate 11 through the through hole.

Further, as to the open stub wiring, a plurality of the open stub wirings having different lengths can be combined by making the lengths of the connection wirings 13-1 and 13-2 on the upper surface of the substrate 11 and the connection wirings 14-1 and 14-2 on the back surface of the substrate 11, and the total number of through holes different from each other.

Note that, in the filter of the signal transmission circuit 12 according to the structure of the present embodiment, if the connection wirings 13-1 to 13-2 and 14-1 to 14-2 between the through holes are set to have a constant length, a resonance frequency can be set by the number of the through holes. Further, the cutoff frequency of the filter according to the structure of the present embodiment has a cutoff characteristic at a frequency of ½ wavelength of propagation delay time Td passing through the via stub wiring. Depending on the thickness of the substrate 11, a frequency range of 6 GHz to 10 GHz can be covered by combining via stub wirings having about six to eight through holes.

Fifth Embodiment

The signal transmission device in a fifth embodiment will be described with reference to FIG. 10. Note that the same portions as those of the third embodiment are denoted by the same reference numerals, and omitted from the description. In the present embodiment, the wiring pattern is improved in order to further improve the transmission characteristic of a high-speed signal.

Figure 10:
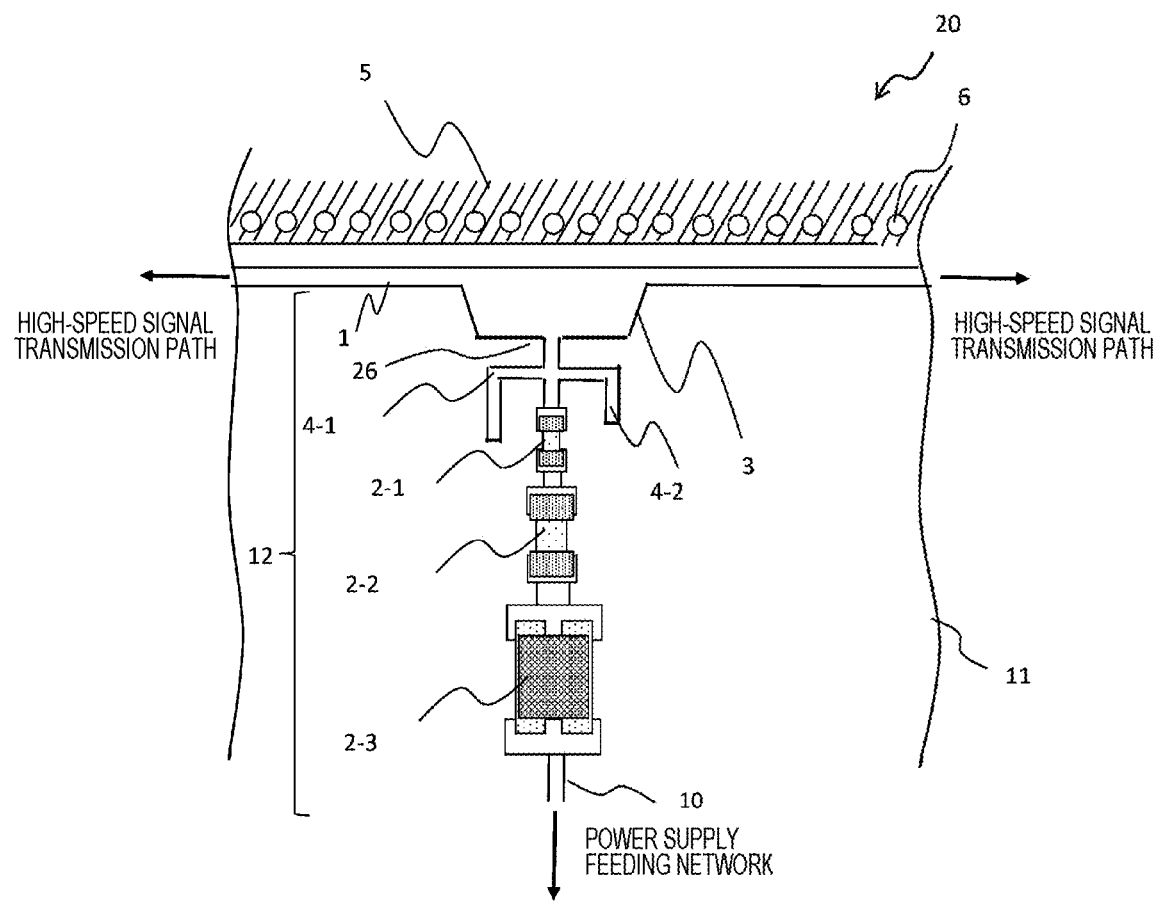
FIG. 10 is a diagram illustrating a configuration of the signal transmission device according to a fifth embodiment.

FIG. 10 is a top view illustrating a configuration of the signal transmission device 20 in the present embodiment. In general, the signal transmission device 20 desirably has a wiring structure in which a high-speed signal is transmitted to the signal wiring 1 and a high-speed signal is not transmitted to the power wiring 10 as much as possible. For this reason, when a high-speed signal flows through the wide wiring 3, it is desirable that the current concentrate on the side opposite to the branch wiring 26 and the power wiring 10. In the present embodiment illustrated in FIG. 10, a ground wiring pattern 5 is provided adjacent to the signal wiring 1 on the same layer as the signal layer of the substrate 11 on the side opposite to the branch wiring 26 and the power wiring 10, and a structure in which a part of the return current flows through the ground wiring pattern 5 is formed. Further, the ground via 6 is provided in the ground wiring pattern 5 to be connected to a ground wiring (not illustrated) on a lower layer of the substrate 11.

Further, a wide portion of the wide wiring 3 has a trapezoidal shape protruding toward the side of the branch wiring 26 and the power wiring 10. In this manner, the disturbance of the impedance from the signal wiring 1 to the wide wiring 3 can be reduced.

In this manner, the radio-frequency current passing through the signal wiring 1 flows to the side close to the ground wiring pattern 5, and the passing characteristic of the high-speed signal flowing through the signal wiring 1 is improved. Note that the signal transmission circuit 12, which has been described by exemplifying the signal transmission circuit 12 described in the third embodiment illustrated in FIG. 6, may be another signal transmission circuit 12.

Sixth Embodiment

The signal transmission device in a sixth embodiment will be described with reference to FIG. 11. Note that the same portions as those of the fifth embodiment are denoted by the same reference numerals, and omitted from the description. In the present embodiment, an example in which the signal transmission device is arranged in high density will be described.

Figure 11:
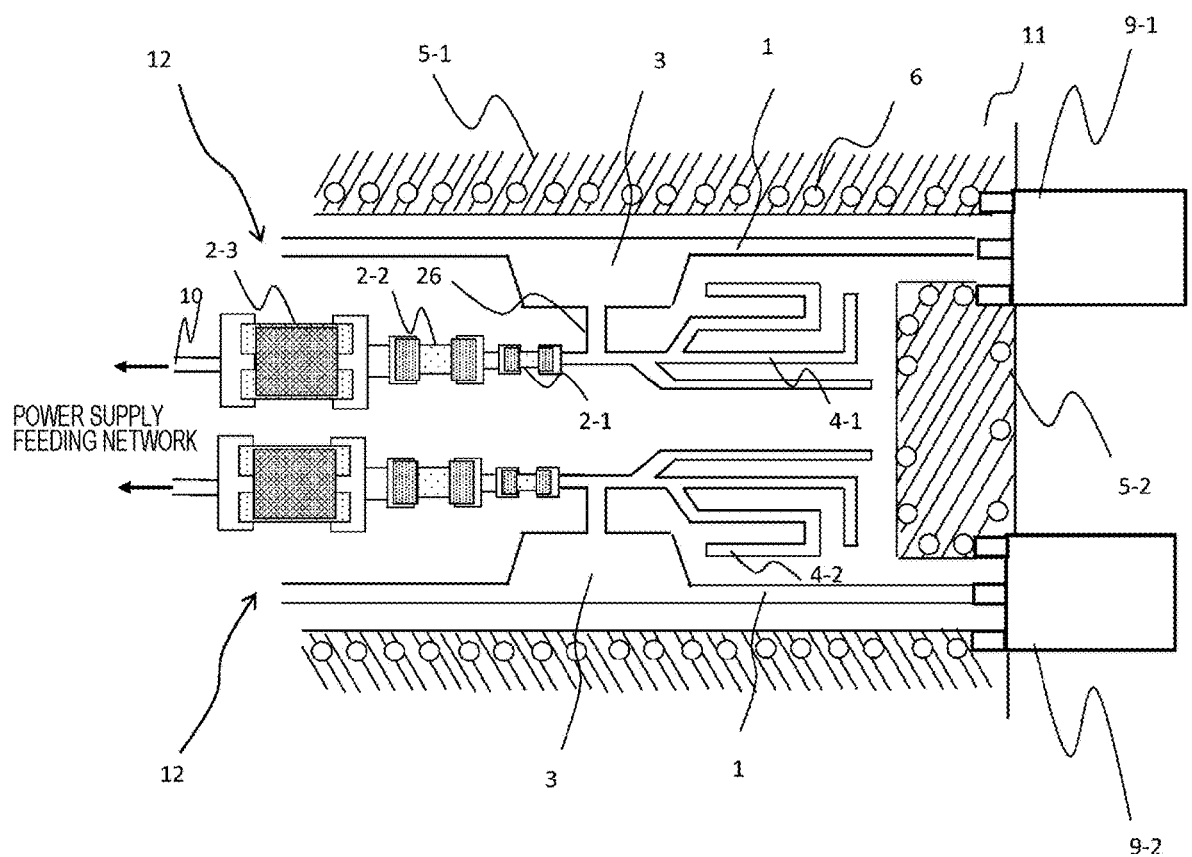
FIG. 11 is a diagram illustrating a configuration of the signal transmission device according to a sixth embodiment.

FIG. 11 is a top view illustrating a configuration of the signal transmission device according to the present embodiment. As illustrated in FIG. 11, the cable connectors 9-1 and 9-2 are arranged on an end surface of the substrate 11. The signal wiring 1 connected to a center terminal of the cable connectors 9-1 and 9-2 is formed on the substrate 11. In FIG. 11, the signal transmission circuits 12 are arranged to be vertically symmetrical. That is, the wide wiring 3 is formed in a central portion of the signal wiring 1. Then, the wide wiring 3 branches to a branch wiring 26, and is connected to the power wiring 10 via the inductor components 2-1 to 2-3 constituting the signal/power separation filter. Furthermore, what are called the open stub wirings 4-1 to 4-2 in which a wiring branches from the branch wiring 26 connecting the inductor component 2-1 and the wide wiring 3 and a tip of the wiring is in an open state are arranged. Further, a structure in which the arrangement of ground wiring patterns 5-1 and 5-2 and the ground via 6 is provided adjacent to the signal wiring 1 on the same layer as the signal layer of the substrate 11, and a part of the return current flows through the arrangement is formed. The around via 6 is connected to a ground wiring (not illustrated) on a lower layer of the substrate 11.

By arranging the open stub wirings 4-1 to 4-2 on the connector side and the inductor components 2-1 to 2-3 on the side opposite to the connector, it is possible to arrange the signal transmission device in high density while maintaining the connectivity to the connector and the power supply.

Seventh Embodiment

The signal transmission device in a seventh embodiment will be described with reference to FIG. 12. Note that the same portions as those of the third embodiment are denoted by the same reference numerals, and omitted from the description. In the seventh embodiment, the signal transmission device is used for superimposing the power on a differential signal wiring, and for example, there is a power over data line (PoDL) as a usage form.

Figure 12:
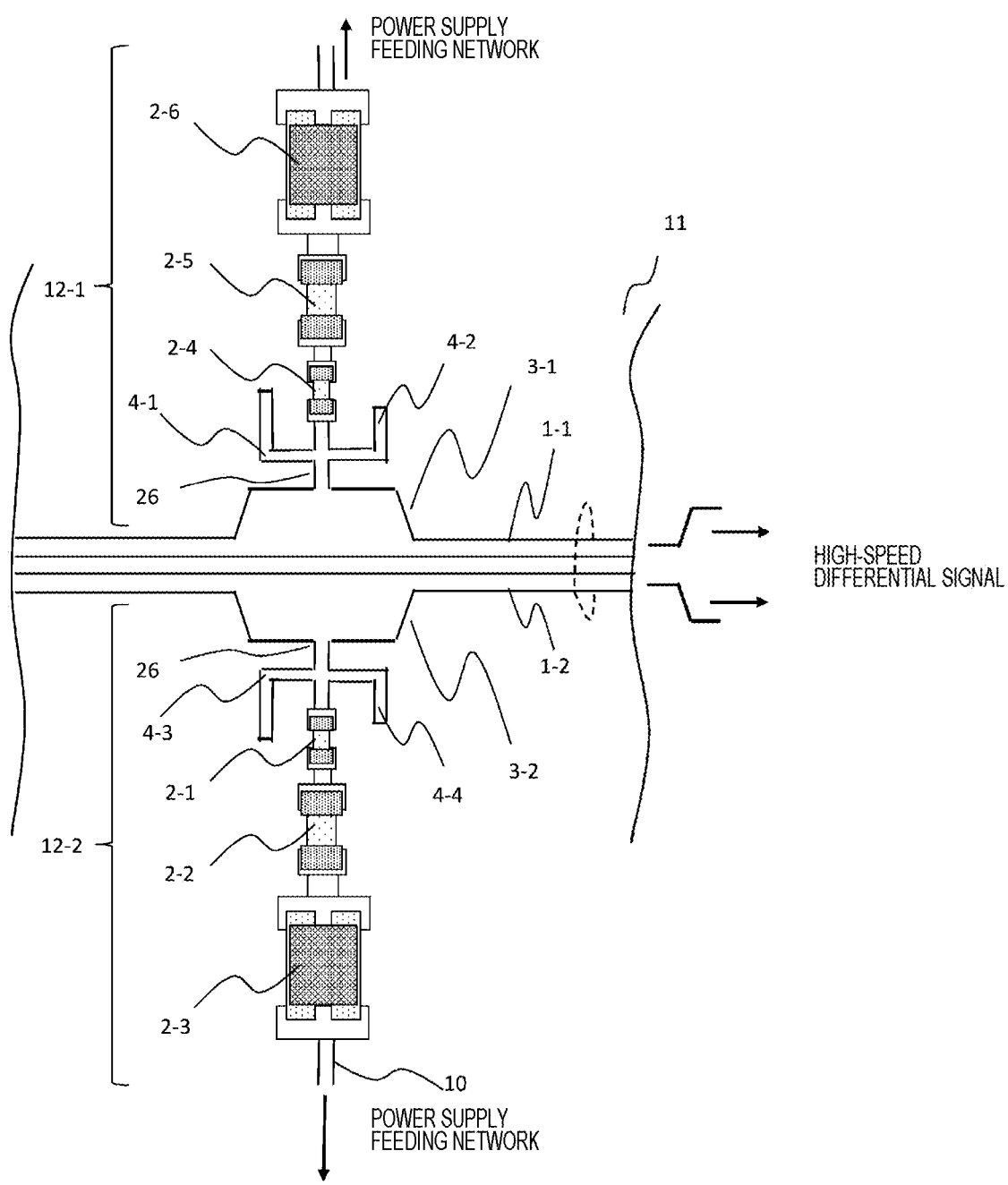
FIG. 12 is a diagram illustrating a configuration of the signal transmission device according to a seventh embodiment.

FIG. 12 is a top view illustrating a configuration of the signal transmission device. As illustrated in FIG. 12, signal wirings 1-1 and 1-2, which are a pair of wirings for differential signals flowing in opposite directions, are wired in parallel close to each other, and wide wirings 3-1 and 3-2 are provided so as to expand to the outer side of the signal wirings 1-1 and 1-2, and the signal wirings 1-1 and 1-2 are connected to the power wiring 10 via the inductor components 2-1 to 2-6 constituting the signal/power separation filter. Furthermore, wirings branch from the branch wiring 26 connecting the inductor components 2-1 to 2-6 and the wide wirings 3-1 and 3-2, so that the open stub wirings 4-1 to 4-4 are arranged.

In other words, the signal transmission device includes a first signal transmission circuit 12-1 having the signal wiring 1-1, the wide wiring 3-1, and the open stub wirings 4-1 to 4-2, and a second signal transmission circuit 12-2 in which the signal wiring 1-1 and the signal wiring 1-2 are arranged adjacent to each other to be symmetric with the first signal transmission circuit 12-1. The second signal transmission circuit 12-2 includes the signal wiring 1-2, the wide wiring 3-2, and the open stub wirings 4-3 to 4-4.

With such arrangement, the radio-frequency current of a differential signal is concentrated on the inner side of the signal line, so that the influence on the transmission characteristic can be suppressed, and the transmission characteristic becomes superior.

Eighth Embodiment

The signal transmission device in an eighth embodiment will be described with reference to FIG. 13. Note that the same portions as those of the sixth embodiment are denoted by the same reference numerals, and omitted from the description. In the present embodiment, the signal transmission device is utilized for superimposing the power on the differential signal wiring, and an example in which the signal transmission device is arranged in high density will be described.

Figure 13:
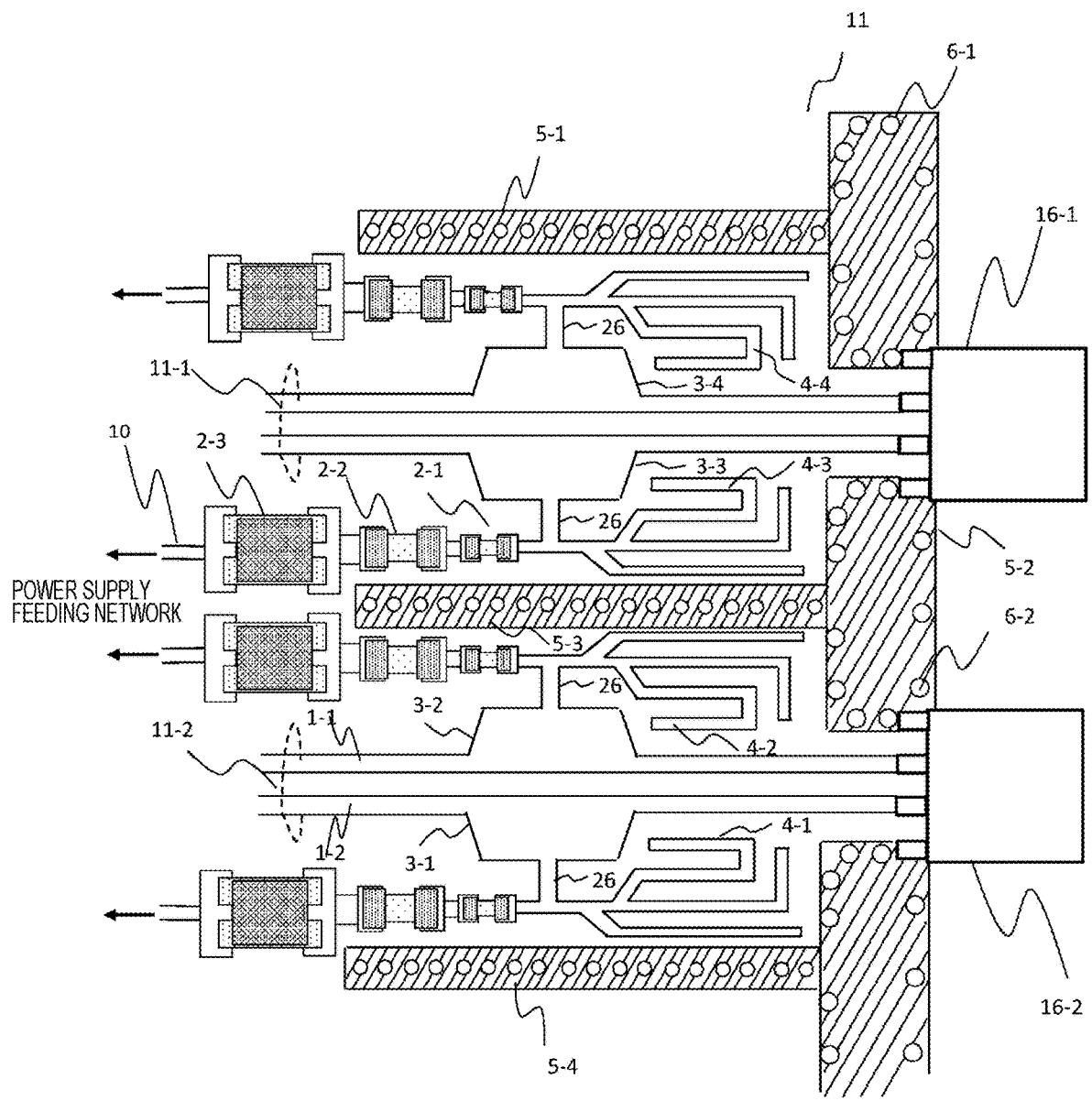
FIG. 13 is a diagram illustrating a configuration of the signal transmission device according to an eighth embodiment.

FIG. 13 is a top view illustrating a configuration of the signal transmission device according to the present embodiment. As illustrated in FIG. 13, differential cable connectors 16-1 and 16-2 are arranged on an end surface of the substrate 11. On the substrate 11, signal wirings 11-1 and 11-2 of two differential signals connected to terminals of the differential cable connectors 16-1 and 16-2 are formed. In FIG. 13, two sets of the signal transmission devices are arranged to be vertically symmetrical. The wide wirings 3-1 to 3-4 are formed in a central portion of the signal wirings 11-1 and 11-2. Then, the wide wirings 3-1 to 3-4 branch to the branch wiring 26, and are connected to the power wiring 10 via the inductor components 2-1 to 2-3 constituting the signal/power separation filter.

Furthermore, wirings branch from the branch wiring 26 connecting the inductor components 2-1 to 2-3 and the wide wiring 3, so that the open stub wirings 4-1 to 4-4 are arranged. Further, a structure in which the arrangement of the ground wiring patterns 5-1 to 5-4 and the ground vias 6-1 and 6-2 is provided on the same layer as the signal layer of the substrate 11, and a part of the return current flows through the arrangement is formed. The ground vias 6-1 and 6-2 are connected to a ground wiring (not illustrated) on a lower layer of the substrate 11.

By arranging the open stub wirings 4-1 to 4-4 on the connector side and the inductor components 2-1 to 2-3 on the side opposite to the connector, it is possible to arrange the signal transmission device in high density while maintaining the connectivity to the connector and the power supply.

Ninth Embodiment

An application example of the signal transmission device in a ninth embodiment will be described with reference to FIG. 14.

Figure 14:
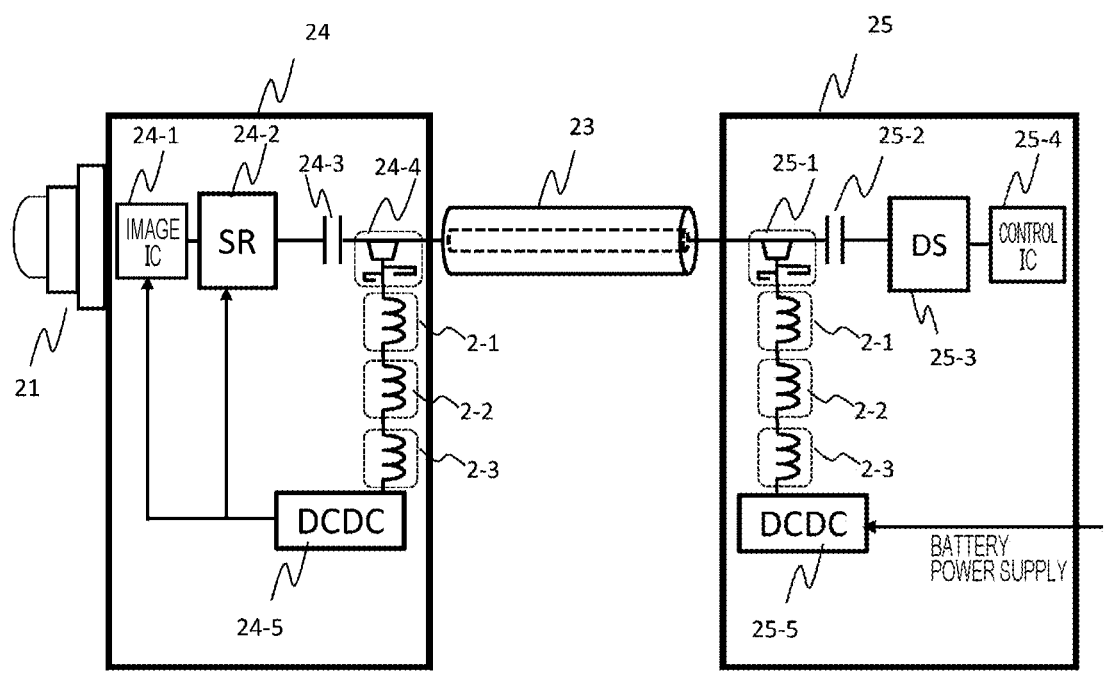
FIG. 14 is a diagram illustrating an example of the signal transmission device in which a camera unit and a control unit are connected by a coaxial cable.

FIG. 14 illustrates an example of the signal transmission device in which a camera unit 24 and a control unit 25 are connected by a coaxial cable 23. By using the coaxial cable 23, power is supplied from the control unit to the camera unit 24, and a signal is mainly transmitted from the camera unit 24 to the control unit 25 at a high speed via the same coaxial cable 23.

The camera unit 24 includes a camera 21, an image IC 24-1, a serializer 24-2, and a capacitor 24-3. Image data captured by the camera 21 is subjected to image processing by the image IC 24-1, converted into serial data by the serializer 24-2, and transmitted to a wiring portion 24-4 formed by a signal wiring and a wide wiring via a capacitor 24-3 for DC cutoff. In contrast, the power supplied via the coaxial cable 23 branches from the wide wiring to a branch wiring, and is supplied to a DC-DC converter 24-5 via the inductor components 2-1 to 2-3 constituting the signal/power separation filter. The DC-DC converter 24-5 supplies power to the camera 21, the image IC 24-1, and the serializer 24-2. Note that the wiring portion 24-4 and the inductor components 2-1 to 2-3 are the signal transmission device described in the first to eighth embodiments.

The control unit 25 includes a wiring portion 25-1, a capacitor 25-2, a de-serializer 25-3, and a control IC 25-4. A signal transmitted to the wiring portion 25-1 is transmitted to the de-serializer 25-3 via the capacitor 25-2 for DC cutoff, converted into parallel data by the de-serializer 25-3, and input to the control IC 25-4. In contrast, upon receiving power from a battery or the like, a DC-DC converter 25-5 supplies predetermined power to the coaxial cable 23 via the inductor components 2-1 to 2-3 and the wiring portion 25-1 constituting the signal/power separation filter.

As described above, the signal wiring in the wiring portion 24-4 of the camera unit 24 and the signal wiring in the wiring portion 25-1 of the control unit 25 are connected via the coaxial cable 23 between the serializer 24-2 that transmits a signal from the camera 21 and the de-serializer 25-3 that receives a signal from the camera 21. Note that, in the present embodiment, the example in which the camera unit 24 and the control unit 25 are connected by the coaxial cable 23 is described. However, the camera unit 24 and the control unit 25 may be connected by other connection cables, for example, pattern wiring or the like, instead of the coaxial cable 23.

As illustrated in the present embodiment, by providing the signal transmission device described in the first to eighth embodiments in both the camera unit 24 and the control unit 25, even a large amount of image data can be transmitted at a high speed by data communication of 10-Gbps class. Further, power from the DC-DC converter 25-5 of the control unit 25 passes through the power wiring of the wiring portion 25-1, the inductor components 2-1 to 2-3, and the signal wiring, and is input to the camera unit 24 via the coaxial cable 23. Then, the power is supplied to the camera 21 via the DC-DC converter 24-5 after passing through the signal wiring of the wiring portion 24-4, the inductor components 2-1 to 2-3, and the power wiring. In this manner, it is possible to supply power to the camera using the signal transmission device described in the first to eighth embodiments.

According to the embodiments described above, a function and an effect described below can be obtained.

(1) The signal transmission device 20 includes the signal wirings 1, 11-1, and 11-2, the wide wirings 3, and 3-1 to 3-4 that are formed continuously with one and the other of the signal wirings 1, 11-1, and 11-2 and have a wiring width larger than a wiring width of at least one or the other of the signal wirings 1, 11-1, and 11-2, the power wiring 10 to which the signal/power separation filter is connected via the branch wiring 26 branching from the wide wirings 3, and 3-1 to 3-4, and the open stub wirings 4-1 to 4-4 that are connected to the branch wiring 26 and have an open tip. In this manner, the range of the filter frequency can be widened to the radio frequency side.

(2) The signal transmission device 20 includes the signal wirings 1, 11-1, and 11-2, the wide wirings 3, and 3-1 to 3-4 that are formed continuously with the signal wirings 1, 11-1, and 11-2 and have a wiring width larger than a wiring width of the signal wirings 1, 11-1, and 11-2, the power wiring 10 to which the signal/power separation filter is connected via the branch wiring 26 branching from the wide wirings 3, and 3-1 to 3-4, and the open stub wirings 4-1 to 4-4 that are connected to the branch wiring 26 and have an open tip. In this manner, the range of the filter frequency can be widened to the radio frequency side.

The present invention is not limited to the above-described embodiment, and other forms conceivable within the scope of the technical idea of the present invention are also included in the scope of the present invention as long as the characteristics of the present invention are not impaired. Further, a configuration in which the above-described embodiments are combined may be employed.

The disclosure of the following priority application is incorporated herein by reference:

Japanese Patent Application No. 2019-005207 (filed on Jan. 16, 2019)

REFERENCE SIGNS LIST 1, 11-1, 11-2 signal wiring
2-1 to 2-3 inductor component
3, 3-1 to 3-4 wide wiring
4-1 to 4-4 open stub wiring
5, 5-1 to 5-4 ground wiring pattern
6, 6-1, 6-2 ground via
7-1 to 7-2 ground wiring
9-1 to 9-2 cable connector
10 power wiring
11 substrate
12-1 to 12-2 signal transmission circuit
13-1 to 13-2, 14-1 to 14-2 connection wiring
15-1 to 15-4 through hole
16-1 to 16-2 differential cable connector
20 signal transmission device
23 coaxial cable
24 camera unit
21 camera
24-1 image IC
24-2 serializer
24-3 capacitor
24-4, 25-1 wiring portion
24-5, 25-5 DC-DC converter
25 control unit
25-2 capacitor
25-3 de-serializer
25-4 control IC
26 branch wiring

The invention claimed is:

1. A signal transmission device comprising:
a signal wiring;
a wide wiring that is formed continuously with the signal wiring and has a wiring width larger than a wiring width of the signal wiring;
a branch wiring that is branched from the wide wiring;
a signal/power separation filter that is connected to the branch wiring;
a power wiring that is connected to the branch wiring via the signal/power separation filter; and
an open stub wiring that is connected to the branch wiring and has an open tip.

2. The signal transmission device according to claim 1, wherein
a ground wiring pattern through which return current flows is provided adjacent to the signal wiring on a side opposite to the branch wiring.

3. The signal transmission device according to claim 1, wherein
the open stub wiring includes a plurality of the open stub wirings having different lengths.

4. The signal transmission device according to claim 1, wherein
the signal wiring is connected between a transmission unit that transmits a signal from a camera and a receiving unit that receives a signal from the camera, and
power is supplied to the camera through the power wiring and the signal wiring.

5. The signal transmission device according to claim 1, further comprising:
a first signal transmission circuit including a first signal wiring, a first wide wiring, a first open stub wiring, and a first power wiring; and
a second signal transmission circuit including a second signal wiring, a second wide wiring, a second open stub wiring, and a second power wiring, wherein
the first signal transmission circuit and the second signal transmission circuit are symmetrically arranged such that the first signal wiring and the second signal wiring are adjacent to each other.

6. The signal transmission device according to claim 1, wherein
a wiring width of the wide wiring is at least twice or more a wiring width of the signal wiring.

7. The signal transmission device according to claim 1, wherein
a wide portion of the wide wiring has a trapezoidal shape protruding toward a side of the power wiring.

8. The signal transmission device according to claim 1, wherein
a length of a wide portion of the wide wiring is shorter than a wavelength corresponding to time that is $\frac{1}{10}$ of a period of a signal transmitted through the signal wiring.

9. The signal transmission device according to claim 1, wherein
power is supplied from a camera unit to a control unit via a coaxial cable,
a signal is transmitted and received between the camera unit and the control unit via the coaxial cable, and
the signal wiring, the wide wiring, and the open stub wiring are formed on a substrate of at least one of the camera unit and the control unit.

10. The signal transmission device according to claim 1, wherein
the open stub wiring has a first end side connected to the branch wiring between the wide wiring and the signal/power separation filter and a tip of a second end side opposite the first end side is open.

11. The signal transmission device according to claim 1, wherein
the signal wiring, the wide wiring, the branch wiring, and the open stub wiring are formed on a printed circuit board.

12. The signal transmission device according to claim 11, wherein a distance between the wide wiring and a ground wiring on a lower layer of the printed circuit board is longer than a distance between the signal wiring and a ground wiring on a lower layer of the printed circuit board.

13. The signal transmission device according to claim 11, wherein the open stub wiring is formed by a plurality of pieces of reciprocation between an uppermost layer and a lowermost layer of the printed circuit board using through holes connecting a wiring on the uppermost layer and a wiring on the lowermost layer.

14. The signal transmission device according to claim 13, wherein the open stub wiring is a combination of a plurality of open stub wirings in which lengths of the wirings and a total number of the through holes are different from each other.

15. A signal transmission device comprising:

a signal wiring;

a branch wiring that is branched from the signal wiring;

a signal/power separation filter that is connected to the branch wiring;

a power wiring that is connected to the branch wiring via the signal/power separation filter; and an open stub wiring in which a first end side is connected to the branch wiring between the signal wiring and the signal/power separation filter and a tip of a second end side opposite the first end side is open.

\* \* \* \* \*